United States Patent
Lehmann

[19]

[11] 4,395,643
[45] Jul. 26, 1983

[54] BROADBAND CIRCUIT WITH RAPIDLY VARIABLE RESISTOR

[75] Inventor: Klaus Lehmann, Mühltal, Fed. Rep. of Germany

[73] Assignee: Robert Bosch GmbH, Stuttgart, Fed. Rep. of Germany

[21] Appl. No.: 212,935

[22] Filed: Dec. 4, 1980

[30] Foreign Application Priority Data

Dec. 15, 1979 [DE] Fed. Rep. of Germany ....... 2950584

[51] Int. Cl.³ .......................... H03L 5/00; H03G 3/20
[52] U.S. Cl. .................................. 307/264; 307/358; 307/493; 307/495; 330/144; 330/284
[58] Field of Search .............................. 307/358–359, 307/491, 264, 493–495, 553; 330/144, 278–279, 282, 284

[56] References Cited
U.S. PATENT DOCUMENTS

| 3,537,025 | 10/1970 | Baum et al. | 330/278 X |
| 3,633,044 | 1/1972 | Buckstad | 307/494 |
| 3,904,975 | 9/1975 | Satoh | 330/284 |
| 3,968,452 | 7/1976 | Sahara et al. | 330/284 X |
| 3,969,680 | 7/1976 | Wermuth | 330/282 |
| 4,077,014 | 2/1978 | Satoh | 330/278 |
| 4,220,931 | 9/1980 | Hines et al. | 330/284 |
| 4,306,202 | 12/1981 | Schröder | 330/284 X |

OTHER PUBLICATIONS

Davis, "Bi-FET OP AMPS Simplify AGC Threshold Design"; Electronics, pp. 184-185; 4/21/81; vol. 54, No. 7.
Analog Multiplizierer mit isolierenden Kopplern. Elektronik 1968, Heft 8, pp. 233-238, esp 237-238.
W. Gosling, Circuit Applications of FET's Part 3, Applications Below Pinch-Off, British Comm. & Electronics, Dec. 1964, pp. 856-858.

Primary Examiner—Stanley D. Miller
Assistant Examiner—David R. Hudspeth
Attorney, Agent, or Firm—Frishauf, Holtz, Goodman & Woodward

[57] ABSTRACT

To provide for essentially inertia-free amplitude adjustment of video signals, an electrical circuit is provided with a field effect transistor having variable source-drain resistance. The circuit includes two junction transistors which are connected to the gate electrode of the field effect transistor and either to the source electrode or the drain electrode. One such transistor is connected as an impedance converter, and the other in grounded base configuration. By means of a variable voltage applied to a resistor is connected to the gate electrode of the field effect transistor, source-drain resistance of the field effect transistor can be varied essentially linearly.

8 Claims, 6 Drawing Figures

BROADBAND CIRCUIT WITH RAPIDLY VARIABLE RESISTOR

The present invention relates to electrical circuitry which includes a variable resistor. More particularly, such circuitry includes a field effect transistor in which the resistance between source and drain can be varied by means of a control voltage which is applied to a resistor connected to the gate electrode.

BACKGROUND AND PRIOR ART

One important application of variable resistance circuitry is in transmission circuits having a variable transmission factor; such circuits are also known as multipliers. Typically, a field effect transistor is used as variable resistor, one of the factors to be multiplied is represented by a source-drain current, another factor is represented by the source-to-drain resistance of the field effect transistor, and, according to Ohm's law, the voltage across the resistance represents the product of the two factors.

In view of the nonlinear relationship between gate voltage and source-drain resistance of a field effect transistor, a combination of two variable resistance field effect transistors has been proposed, one such field effect transistor being for the control of the transmission factor, and the other serving as a comparison resistor in a negative feedback circuit. (See *Communications and Electronics*, December 1964, pp. 857-858.)

It is further known to compensate for the dependence of the source-drain resistance on the applied voltage by feedback of half the drain voltage to the gate electrode. (See *Elektronik* 1968, No. 8, pp. 236-237.)

The known circuitry is considered to be insufficiently suitable, however, for handling video signals and, in particular, for the rapid adjustment of the amplitude of broadband signals. For example, in the circuit shown in the above-cited reference, "Elektronik", coupling between drain and gate electrodes is by means of high-resistance resistors; because of the capacitance of the gate electrode, such negative feedback is effective only for an insufficient range of the video spectrum. Reducing resistance in this known circuit improves frequency behavior but severely restricts the range of adjustment of the variable resistor, this because such a resistor is parallel to the source-drain path of the field effect transistor for those signals for which the transmission factor is to be variable.

In a different known circuit of the above-mentioned type, an attempt is made to achieve feedback of the drain voltage to the gate electrode by frequency independent means. This, however, does not contribute to the solution of the problem of the invention, namely the adjustment of amplitude of broadband signals having frequency components in essentially one and the same frequency range from 0 to, e.g., 10 MHz; in other words, the multiplication of the two broadband signals.

THE INVENTION

It is an object of the present invention to provide a broadband variable resistor circuit which not only has a wide range of settings but which also permits resistance control essentially without inertia.

In accordance with the invention, a variable resistance electrical circuit includes a field effect transistor and at least one pair of junction transistors. These transistors connect either the source electrode or the drain electrode of the field effect transistor to the gate electrode of the field effect transistor, one transistor being connected as an impedance converter between such electrodes, and the other being connected between such electrodes in grounded base configuration. A resistor is connected to the gate electrode of the field effect transistory. Operation of the circuit in accordance with the invention is by applying a variable voltage to this resistor, resulting in essentially linearly corresponding variable source-drain resistance of the field effect transistor.

THE DRAWING

Embodiments of the invention are shown by several figures in the drawing and are described below.

Figure 1:
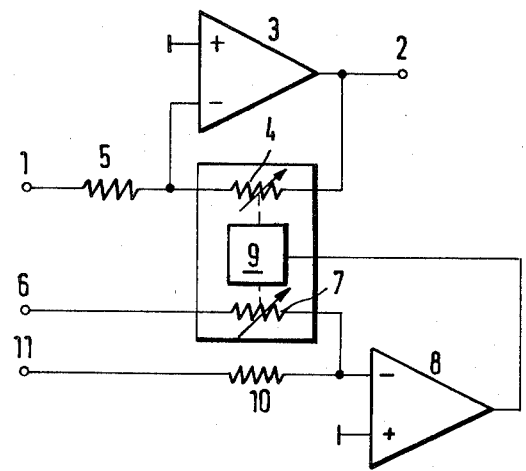
FIG. 1 shows a circuit having a variable transmission factor.

By means of circuitry shown in FIG. 1, damping of signals supplied to input terminal 1 can be controlled such that signals available at output terminal 2 have constant amplitude in spite of varying amplitude of signals at input terminal 1. This is effected by control of negative feedback of amplifier 3 by means of variable resistor 4. In the case of a high degree of amplification of amplifier 3, feedback results in amplification corresponding to the ratio of resistance of resistors 4 and 5. If, for example, the resistance of resistor 4 is made variable between the values 600 and 60 ohms, and if the resistor 5 has a resistance 1200 ohms, a range of transmission factors of 0.5–0.05 is realized between terminals 1 and 2.

The resistor 4 is preferably implemented by means of a field effect transistor. However, since the source-drain resistance of a field effect transistor typically is not a linear function of the gate voltage, the gate voltage may have to vary nonlinearly to produce a linearly varying transmission factor. Since a linearly varying transmission factor is desired in most applications of such variable resistors, the circuitry according to FIG. 1 is provided with means for effecting a multiplication between the signal supplied to input terminal 1 and a control voltage supplied to control input terminal 6. To this effect, an additional variable resistor 7 is an element of a negative feedback loop which is formed by an additional amplifier 8 and a control circuit 9 described below. The amplifier 8 is also implemented in the form of a differential amplifier. The control input terminal 6 is connected to the inverting input of amplifier 8 by means of variable resistor 7. Moreover, a fixed resistor 10 connected to the inverting input to an additional input terminal 11 of the circuit of FIG. 1. If an additional control voltage is supplied to this input terminal 11, a division of the input signal supplied at input terminal 1 is effected.

Use of the negative feedback loop described above results in continuous adjustment of the resistance of the variable resistor 7 so as to produce near-zero voltage at the inverting input of differential amplifier 8. Since current in resistors 7 and 10 is the same, the resistor 7 is so controlled by the negative feedback loop that the resistance ratio of resistors 7 and 10 corresponds to the ratio of voltages applied at input terminals 6 and 11. Accordingly, the resistance of resistor 7 is proportional to the voltage applied at input terminal 6. Since, moreover, the transmission factor between terminals 1 and 2 is proportional to the resistance of resistor 4, the transmission factor is proportional to the voltage applied at terminal 6 and inversely proportional to the voltage applied at terminal 11. Accordingly, a signal applied at terminal 1 is multiplied by the voltage applied at terminal 6 and divided by the voltage applied at terminal 11.

Use of field effect transistors as variable resistors is predicated on dependence of source-drain resistance on gate voltage and independence of source-drain resistance of source-drain voltage, the latter being the case without special precautions. In fact, very good linearity is achieved by applying, in addition to the gate control voltage, half of the source-drain voltage to the gate electrode. Particular circuits in accordance with the invention, which are effective in the system context just described, are shown in FIGS. 2–4.

Figure 2:
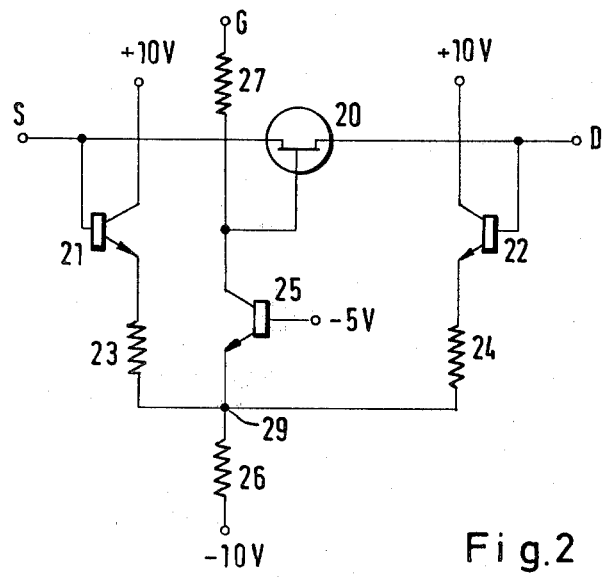
FIG. 2 shows a circuit in accordance with the invention having a variable resistor.

In the arrangement in accordance with FIG. 2, the field effect transistor 20 is provided as a variable resistor, source electrode S and drain electrode D being connected to the bases of transistors 21 and 22, respectively. The collectors of these transistors are connected to a positive operating voltage, and their emitters are connected, via resistors 23 and 24, to the emitter of an additional transistor 25 and a resistor 26. The resistor 26 is connected to a negative operating voltage. The base of the additional transistor 25 is connected to a suitable negative constant potential, and its collector is connected to the gate electrode of field effect transistor 20. This gate electrode also receives, via resistor 27, the gate control voltage $U_G$, which is applied at terminal 6. If, for example, the voltage varies at the electrode D of the field effect transistor, such change of voltage is transmitted from the base of transistor 22 to its emitter. And, since the latter is very low-ohmic, a current which is proportional to this change of voltage flows in resistor 24. This change of current is transmitted from transistor 25 through resistor 27. The resistance of resistor 27 is only half that of resistor 24, so that the drop of voltage across resistor 27 corresponds to half the change of voltage at electrode D of the field effect transistor. Similarly, one half of the amount of a voltage change at the electrode S is supplied via transistor 21, resistor 23, transistor 25 and resistor 27 to the gate electrode of field effect transistor 20.

Since one half of the voltage at electrodes S and D is applied to the gate electrode, the circuit in accordance with FIG. 1 is suitable for use in circuitry in which both electrodes of the field effect transistor are supplied with variable voltages. If, however, a variable resistor is connected to a circuit such that one of its terminals is at constant potential, feedback of the voltage of one electrode is sufficient. This is shown in FIG. 3 in which the drain electrode of a field effect transistor 30 is connected to the base of a transistor 31 whose emitter is connected via resistor 32 to the emitter of an additional transistor 33; the collector of transistor 33 is connected to the gate electrode which receives the control voltage $U_G$ via resistor 34. The collector of transistor 31 is supplied with a positive operating voltage, and the emitter of transistor 33 is supplied, via resistor 35, with a negative operating voltage. The base of transistor 33 receives a suitable constant potential. Operation of the circuit of FIG. 3 corresponds to that of the circuit of FIG. 2.

Figure 3:
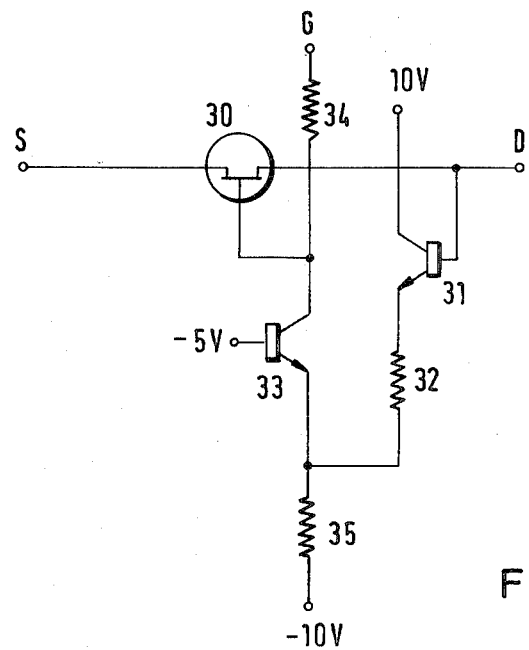
FIG. 3 shows a circuit in accordance with the invention which is simplified as compared with the circuit of FIG. 2.
Figure 4:
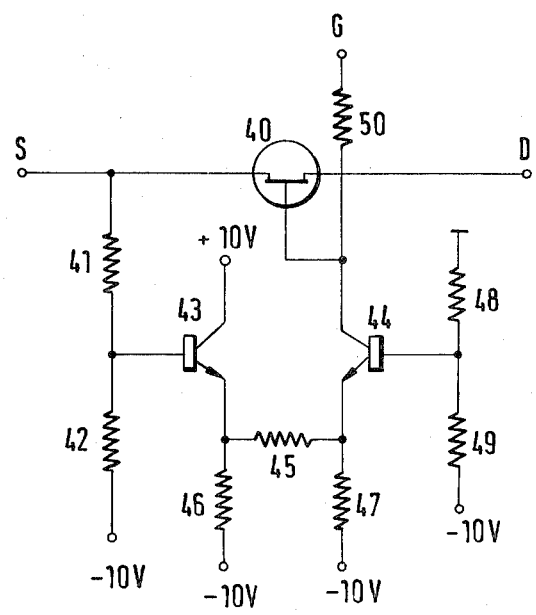
FIG. 4 shows a circuit in accordance with the invention in which high-frequency operation is improved as compared with the circuits of FIGS. 2 and 3.

In circuits of FIGS. 2 and 3, control voltage is applied, respectively, via resistors 27 and 34; this results in little voltage drop because input resistances of the gate electrode of the field effect transistor, as well as of the collector of the transistor, are much larger than the resistances of a few thousand ohms of resistors used in practice in circuits of FIGS. 2 and 3. If, however, it is desired to have source-drain resistance follow control voltages with higher frequency components (i.e., rapidly changing control voltages), then drain-gate and other parasitic capacitances become noticeable. In the interest of essentially inertia-free variability, the resistances of resistors 27 in FIG. 2 and 34 in FIG. 3 are preferably kept as small as possible. This, however, would require rather low-ohmic resistors 23, 24 and 32 which, in turn, would result in a large static current through transistors 21, 22 and 31. This drawback is avoided in circuitry of FIG. 4.

In circuitry in accordance with FIG. 4, the source electrode of field effect transistor 40 is connected to the base of a transistor 43 via a voltage divider which consists of resistors 41 and 42. Such a voltage divider consists of resistors whose resistances are equal, resulting in one half of the voltage at S being applied to the basis of the transistor 43. The emitter of transistor 43 is connected to the emitter of an additional transistor 44 via a resistor 45. Both emitters are further connected via respective resistors 46 and 47 to the negative pole of the voltage source. The base of transistor 44 is supplied with a negative constant voltage by a voltage divider which consists of resistors 48 and 49. The gate control voltage $U_G$ is supplied via resistor 50 to the gate electrode of the field effect transistor. Furthermore, this resistor 50 is a part of the collector loop of transistor 44.

The halved electrode S voltage provided by the voltage divider 41, 42 causes a corresponding current through transistors 43 and 44, current strength being determined by half of the source voltage of field effect transistor 40 and by the resistance effective at the emitter of transistor 43. Such effective resistance is the resistance of resistor 45 in series with the base-emitter resistances of transistors 43 and 44.

By suitable choice of the resistance of resistor 45, this series resistance is the same as the resistance of resistor 50. As a result, half the source voltage of the field effect transistor 40 is supplied to its gate electrode, and the resistance of resistor 50 may be relatively small without causing high static currents in transistors 43 and 44. In practice, a resistance of 100 ohm was found suitable for resistor 50.

Figure 5:
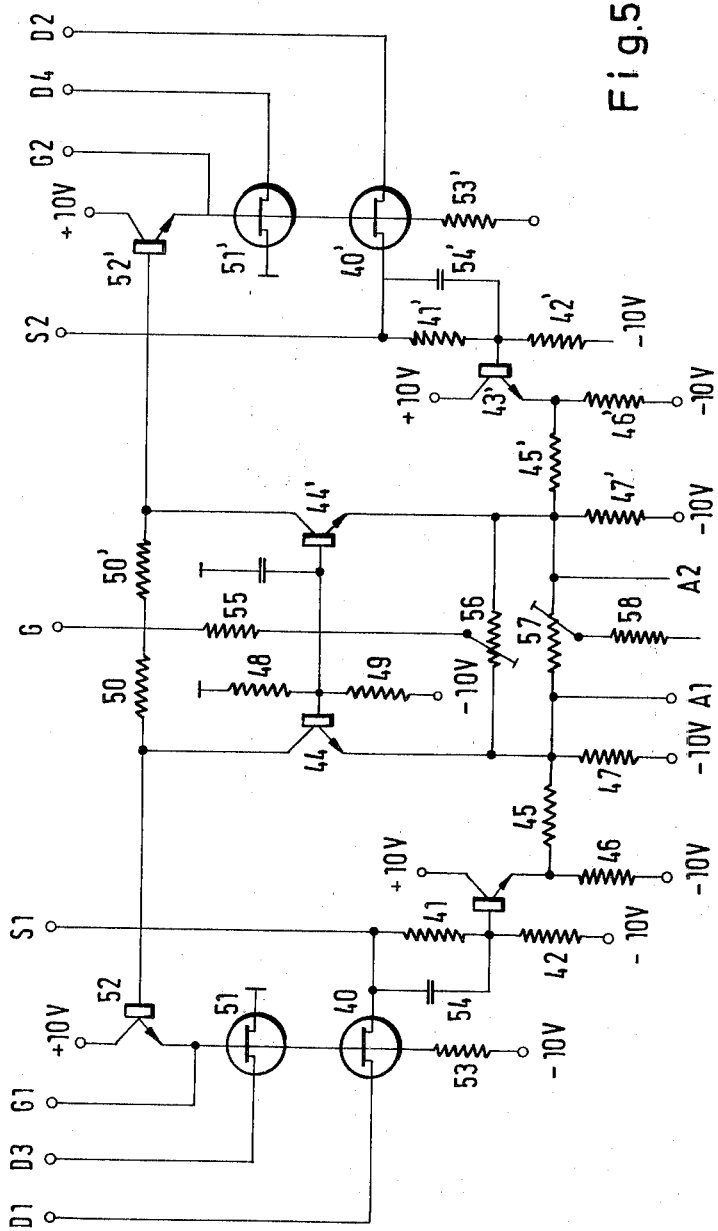
FIG. 5 shows an embodiment of the invention in which the source-drain resistance of four field effect transistors can be jointly increased or decreased, and FIG. 6 schematically shows a circuit with a variable transmission factor in accordance with the invention, cross-talk from a first input to a second input being prevented.

FIG. 5 shows an embodiment of a circuit for realizing a variable resistance in accordance with the circuit of FIG. 4. Reference numbers of elements already shown in FIG. 4 are also used in FIG. 5. The circuit of FIG. 5 includes two circuits as schematically shown in FIG. 4, each of these circuits including two variable resistors. In each of such pairs of resistors, one resistor may be used in accordance with the circuit of FIG. 1 and the other for compensation purposes as described below.

The circuit of FIG. 5 differs from the circuit shown in FIG. 4 in that a transistor 52 is used as an impedance converter between, on the one hand, the connection between the resistor 50 and the collector of transistor 44, and on the other, the gate electrodes of the field effect transistors 40 and 51. The emitter resistor 53 is connected to a negative potential. To compensate for losses in the voltage divider 41,42 at high frequencies, the resistor 41 is bridged by a capacitor 54. Primed reference numbers in FIG. 5 designate elements of the second variable resistance circuit; the electrodes of field effect transistors 40,40', 51 and 51' are designated S1,S2 ... D1,D2 ... and G1,G2, etc. The electrode for the joint control of both variable resistors is designated G.

The use of such circuits in circuitry in accordance with FIG. 1 is based on matching characteristics of variable resistors. To provide for the possibility of adjustment, calibrators 56 and 57 are provided for adjusting, respectively, the slope and the position of the source-drain resistance versus gate voltage characteristics of the field effect transistors. Potentiometer 56 serves to apportion, as needed, the control voltage supplied via resistor 55 between the emitter of transistor 44 and the emitter of transistor 44'.

If the control voltage at terminal G varies rapidly, capacitance between the drain and gate electrodes of the field effect transistor causes the insertion of a voltage spike into the output signal. For the sake of compensation, a preferred embodiment of the invention in accordance, e.g., with FIG. 6 has an additional field effect transistor 51 associated with the field effect transistor 40 (which serves as variable resistor). The gate electrodes of both field effect transistors receive the same control voltage; however, a signal whose amplitude is to be controlled is fed only to field effect transistor 40 and not to field effect transistor 51. As to the effect of the capacitance between gate electrode and drain electrode, both field effect transistors are equally disposed, so that equal spikes are supplied to inverting and noninverting inputs of the amplifier 71, thereby minimizing interference at the output terminal 72 of amplifier 71. As compared with the circuit of FIG. 1, the circuit of FIG. 6 differs further in that the field effect transistor 40 is placed at the input side of the voltage divider which determines the degree of amplification. The negative feedback resistor 73 has fixed resistance. Due to this difference, as compared with the circuit of FIG. 1, a damped output signal can be obtained at terminal 72 in response to an input signal at terminal 74; consequently, this circuit is most suitable where an approximately constant-level signal is supplied at terminal 74 and an output signal is desired whose level can be varied between 0 and the level of the input signal. This is because of the potentially high source-drain resistance of the field effect transistor 40, while the fixed resistor 73 is preferably low-ohmic in the interest of broadband capability of the circuit. A resistance of 68 ohms, for example, was found suitable in practice. The other elements of the circuit of FIG. 6 correspond essentially to those of the circuit of FIG. 1 and are designated with identical reference numbers. Also, the calibrators correspond to those of the circuit of FIG. 5 and have the same reference numbers.

Figure 6:
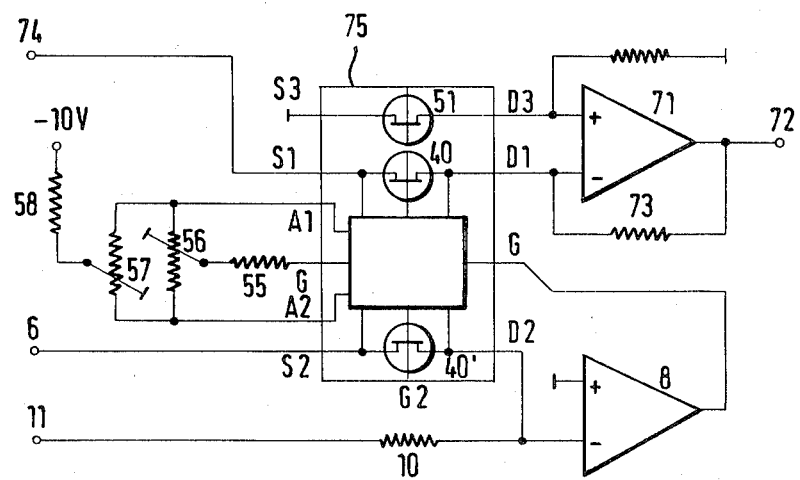

In FIG. 6, a portion of the circuit of FIG. 5 is enclosed by a frame, the field effect transistor 51' being omitted because it is not required for the circuit of FIG. 6. Frame 75 serves to indicate that enclosed components are preferably implemented as a building block, e.g., in the form of integrated circuits for modular use in a variety of circuitry where variable resistors are needed.

Although the invention has been described with reference to several illustrative specific embodiments, it will be understood that further variations and modifications are possible within the inventive concept.

It will be noted that transistors which are not field effect transistors are generally referred to simply as transistors, a practice which is carefully avoided in the case of field effect transistors, which are usually called FETs for short.

I claim:

1. Variable resistance electrical circuit comprising:
    a first field effect transistor (20; 30; 40) having a source electrode, a drain electrode, and a single gate electrode;
    a first resistor (27; 34; 50) which is connected to said gate electrode;
    first transistor (25; 33; 44) connected to said gate electrode;
    a second transistor (21, 22; 31; 43, 44) in a first emitter follower circuit having its input connected to a first electrode, which is either said source electrode or said drain electrode, and furnishing an output to said gate electrode by way of a connection through an electrode of said first transistor other than the electrode thereof most directly connected to said gate electrode,
    said first transistor (25; 33; 44) being connected for common-base mode of operation between said connection through which said second transistor acts and said gate electrode,
    whereby, by means of a variable voltage applied to said resistor (27; 34; 50), the resistance of the source-drain path of said first field effect transistor (20; 30; 40) is variable.

2. Electrical circuit in accordance with claim 1 comprising a second resistor (23, 24; 32) having a resistance which is twice the resistance of said first resistor (27,34), said second resistor being connected between the emitter of said second transistor (21, 22; 31) and the emitter of said first transistor (25; 33).

3. Electrical circuit in accordance with claim 1, comprising a voltage divider (41, 42) and a second resistor (45), said first electrode being connected by means of said voltage divider (41, 42) with the base of said second transistor (43), and said second resistor (45) being connected between the emitter of said second transistor (43) and the emitter of said first transistor (44).

4. Electrical circuit in accordance with claim 1 in which there is also a third transistor (22, 21; 44, 43) which is connected in a further circuit as an emitter follower having its input connected to a second electrode which is that one of said source and drain electrodes which is not said first electrode to which the input of said first emitter follower circuit is connected, said additional emitter follower circuit being in other respects connected in the same manner as said first emitter follower circuit.

5. Electrical circuit in accordance with claim 1 comprising a second emitter follower circuit (52, 52') providing the connection of said first transistor (44, 44') to the gate electrode of said first field effect transistor (40, 40').

6. Electrical circuit in accordance with claim 5 in which there is provided a second field effect transistor (51, 51') whose gate electrode is connected to the gate electrode of said first field effect transistor (40, 40').

7. Electrical circuit in which two variable resistance electrical circuits both in accordance with any one of claims 5-6 are incorporated into an integrated circuit mode in which the base of said first transistor (44) of one of said variable resistance circuits is connected to the base of said first transistor (44') of the other of said variable resistance circuits.

8. Electrical circuit in accordance with claim 6 in which a differential amplifier (71) is provided having its differential inputs respectively connected to said first electrode of said first field effect transistor (40) and to the corresponding electrode of said second field effect transistor (51) and in which a second resistor (73) is provided with which said first field effect transistor (40) constitutes a voltage divider serving to determine the magnitude of the transmission factor of a signal transmission circuit of which said electrical circuit is a part.

* * * * *